(12) United States Patent
Oka (10) Patent No.: US 10,629,783 B2
(45) Date of Patent: Apr. 21, 2020

(54) LIGHT EMITTING DEVICE

(71) Applicant: NICHIA CORPORATION, Anan-shi, Tokushima (JP)

(72) Inventor: Yuta Oka, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 14/552,602

(22) Filed: Nov. 25, 2014

(65) Prior Publication Data
US 2015/0155450 A1    Jun. 4, 2015

(30) Foreign Application Priority Data

Nov. 29, 2013  (JP) .................... 2013-247949

(51) Int. Cl.
| | | |
|---|---|---|
| *H01L 33/56* | (2010.01) | |
| *H01L 21/66* | (2006.01) | |
| *H01L 33/50* | (2010.01) | |
| *H01L 33/60* | (2010.01) | |
| *H01L 25/16* | (2006.01) | |

(52) U.S. Cl.
CPC ............ *H01L 33/504* (2013.01); *H01L 33/60* (2013.01); *H01L 25/167* (2013.01); *H01L 33/505* (2013.01); *H01L 2224/48091* (2013.01); *H01L 2224/48247* (2013.01); *H01L 2224/48257* (2013.01); *H01L 2224/73265* (2013.01)

(58) Field of Classification Search
CPC ......... H01L 33/56; H01L 33/60; H01L 33/52; H01L 2933/0041; H01L 33/50; H01L 2933/005; H01L 33/504; H01L 33/508; H01L 25/167

USPC ..................................................... 257/98, 88
See application file for complete search history.

(56) References Cited

U.S. PATENT DOCUMENTS

| | | | | |
|---|---|---|---|---|
| 9,343,444 | B2* | 5/2016 | Tischler | ............... H01L 25/165 |
| 2008/0048200 | A1* | 2/2008 | Mueller | ................ B29C 41/14 |
| | | | | 257/98 |

(Continued)

FOREIGN PATENT DOCUMENTS

| | | |
|---|---|---|
| JP | 2002-355020 A | 11/2002 |
| JP | 2008-071806 A | 3/2008 |

(Continued)

*Primary Examiner* — Bradley Smith
*Assistant Examiner* — David J Goodwin
(74) *Attorney, Agent, or Firm* — Global IP Counselors, LLP (57) ABSTRACT

Provided is a light emitting device capable of further improving light extraction efficiency while reducing leakage of wavelength unconverted light or color unevenness of the light. The light emitting device includes: a base member; a light emitting element mounted on the base member; a light reflecting member disposed at a side surface side of the light emitting element; and a light-transmissive stacked layer covering at least an upper surface of the light emitting element, wherein the light-transmissive stacked layer includes a first light-transmissive layer, a first wavelength conversion layer disposed on the first light-transmissive layer, a second light-transmissive layer disposed on the first wavelength conversion layer, and a second wavelength conversion layer disposed on the second light-transmissive layer.

15 Claims, 3 Drawing Sheets

(56) References Cited

U.S. PATENT DOCUMENTS

| | | | |
|---|---|---|---|
| 2009/0015137 A1* | 1/2009 | Su | H01J 1/63 313/503 |
| 2010/0065864 A1* | 3/2010 | Kessels | G02F 1/133609 257/89 |
| 2011/0002140 A1 | 1/2011 | Tsukahara et al. | |
| 2011/0221330 A1* | 9/2011 | Negley | H01L 33/504 313/501 |
| 2011/0233586 A1* | 9/2011 | Kojima | H01L 33/0079 257/98 |
| 2011/0233588 A1* | 9/2011 | Deguchi | H01L 33/38 257/98 |
| 2011/0291143 A1* | 12/2011 | Kim | H01L 33/56 257/98 |
| 2011/0309393 A1* | 12/2011 | Greenwood | H01L 33/486 257/98 |
| 2012/0146077 A1* | 6/2012 | Nakatsu | H01L 33/486 257/98 |
| 2012/0182714 A1 | 7/2012 | Kwon et al. | |
| 2012/0217527 A1* | 8/2012 | Ito | H01L 33/46 257/98 |
| 2012/0228653 A1* | 9/2012 | Ishida | H01L 33/504 257/98 |
| 2012/0248484 A1* | 10/2012 | Sato | H01L 33/46 257/98 |
| 2012/0248485 A1* | 10/2012 | Shinbori | H01L 33/56 257/98 |
| 2013/0092966 A1* | 4/2013 | Jaeger | H01L 33/60 257/98 |
| 2013/0181243 A1* | 7/2013 | Wu | H01L 33/505 257/98 |
| 2014/0151734 A1 | 6/2014 | Ito et al. | |
| 2015/0129916 A1* | 5/2015 | Bera | H01L 33/504 257/98 |

FOREIGN PATENT DOCUMENTS

| | | |
|---|---|---|
| JP | 2008-192909 A | 8/2008 |
| JP | 2010-219324 A | 9/2010 |
| JP | 2010-251621 A | 11/2010 |
| JP | 2011-013567 A | 1/2011 |
| JP | 2012-009696 A | 1/2012 |
| JP | 2012-216713 A | 11/2012 |
| JP | 2013-012607 A | 1/2013 |
| JP | 2013-038353 A | 2/2013 |
| WO | 2013-011628 A1 | 1/2013 |

* cited by examiner

LIGHT EMITTING DEVICE

CROSS-REFERENCE TO RELATED APPLICATION

This application claims priority to Japanese Patent Application No. 2013-247949, filed on Nov. 29, 2013. The entire disclosure of Japanese Patent Application No. 2013-247949 is hereby incorporated herein by reference.

BACKGROUND

1. Field of the Invention

The present disclosure relates to a light emitting device.

2. Description of Related Art

In recent years, small light-emitting diodes having good power efficiency and capable of obtaining light of various colors by a light wavelength converting member have been used as various light sources. For example, there is proposed a light emitting device in which a transparent resin layer, a wavelength conversion layer, and a diffusion layer are stacked in this order on a light emitting element (WO 2013/011628). Further, there is proposed a light emitting device in which a sealing member, a phosphor layer, a sealing member, and a phosphor layer are stacked in this order on a light emitting element (JP 2013-12607 A).

SUMMARY OF THE INVENTION

The present disclosure is made to provide a light emitting device in which light extraction efficiency is improved, while reducing leakage of wavelength unconverted light and color unevenness of the light.

A light emitting device according to an embodiment includes a base member, a light emitting element mounted on the base member, a light reflecting member disposed at a side surface side of the light emitting element, and a light-transmissive stacked layer covering at least an upper surface of the light emitting element. The light-transmissive stacked layer includes a first light-transmissive layer, a first wavelength conversion layer disposed on the first light-transmissive layer, a second light-transmissive layer disposed on the first wavelength conversion layer, and a second wavelength conversion layer disposed on the second light-transmissive layer.

According to the light emitting device of the present embodiment, it is possible to further improve light extraction efficiency while reducing light leakage or color unevenness of the light.

BRIEF DESCRIPTION OF THE DRAWINGS

FIGS. 1C(a) to 1C(c) show graphs depicting relations between a directional angle of 0° or 90° and chromaticity of a light emitting device according to an embodiment of the present invention and of a light emitting device of a comparative example, respectively.

DETAILED DESCRIPTION OF EMBODIMENTS

In the present specification, the sizes and positional relationships of the members in each of the drawings may be shown exaggerated for ease of explanation. In the following description, like names and like reference numerals designate like or the same components, and detailed descriptions for such components shall be omitted if not necessary. Descriptions that are made for one example and one embodiment are applicable to other examples, embodiments, and the like.

A light emitting device according to the present embodiment includes a base member, a light emitting element, a light reflecting member, and a light-transmissive stacked layer. The light emitting device may be a side-view type light emitting device or a top-view type light emitting device, but a top-view type light emitting device is particularly preferable.

(Base Member)

The light emitting device generally includes a base member for mounting a light emitting element. The base member is generally made of an insulating material such as a glass epoxy, a resin, and a ceramic (e.g. HTCC, LTCC), a composite material of an insulating material and a metallic member, or the like. The base member preferably utilizes a ceramic or a thermosetting resin that is highly heat-resistant and weather-resistant. Examples of the ceramic material include alumina, aluminum nitride, and mullite. The base member may be formed by combining the ceramic material with an insulating material such as a BT resin, a glass epoxy, or an epoxy-based resin. Examples of the thermosetting resin to be used include an epoxy resin, a triazine derivative epoxy resin, a modified epoxy resin, a silicone resin, a modified silicone resin, an acrylate resin, and a urethane resin. Among those, it is more preferable to use a triazine derivative epoxy resin.

The shape of the base member is not particularly limited. The base member may have a plate-like body with a flat surface, or a reflector-like member with a sloped surface may be disposed on or integrally provided with the plate-like body. The reflector-like member may be made of the same material as that of the base member which has a plate-like body, or may be made of a different material.

A conductive member to be connected to a light emitting element is generally provided on a surface and/or inside of the base member. Examples of the conductive member include a wiring pattern and a lead frame disposed on the base member. The wiring pattern may be formed by using a metal such as copper, aluminum, gold, silver, tungsten, iron, or nickel, an alloy such as an iron-nickel alloy or phosphor bronze, or the like. Further, in a case where the wiring pattern is disposed on the surface, the surface may be coated by a reflective coating in order to efficiently extract light from the light emitting element to be mounted. Further, the wiring pattern may be bent or deformed on the surface or in the inside of the base member. The thickness of the wiring pattern may be several micrometers to several hundred micrometers, for example. The lead frame may be made of, for example, aluminum, iron, nickel, copper, a copper alloy, a stainless steel, an Invar alloy, or the like. The lead frame may be made of a clad material in which different kinds of metals are clad. A surface of the lead frame is preferably coated by gold, silver, nickel, palladium, or an alloy thereof.

The thickness of the lead frame may be several tens of micrometers to a thousand micrometers, for example. Such a base member described above is known in the art, and any appropriate base member used for implementing a light emitting element or the like can be employed.

The conductive member may be used not only for providing electrical connection with the light emitting element, but also for providing additional functions such as mounting a light emitting element or a protective element, improving heat-dissipating property, and providing electrical connection with the protective element. Therefore, the base member may include not only a pair of positive and negative conductive members, but also one or more patterns corresponding to the conductive members.

Depending on the material of the base member and the conductive member, or depending on the material or presence of the reflector-like member described above, it is preferable that a surface of the base member and/or the conductive member and/or the reflector-like member is covered by a reflective material layer, excluding a region where the light emitting element is mounted, as will be described below. As used herein, the reflective material layer may be formed by selecting from materials that constitute the light reflecting member, which will be described below. The reflective material layer may also be formed by the light reflecting member itself which will be described below. In other words, the reflective material layer may also serve as the light reflecting member.

(Light Emitting Element)

The light emitting element used in the present embodiment refers to a light-emitting diode. In particular, examples of the light emitting element include a stacking structure in which light emitting layers made of various semiconductors such as a nitride semiconductor such as InN, AlN, GaN, InGaN, AlGaN, and InGaAlN, a group III-V compound semiconductor, a group II-VI compound semiconductor, and the like are formed on a substrate.

The light emitting element may be configured such that a positive electrode and a negative electrode are respectively formed on opposing surfaces, or such that both of the positive electrode and the negative electrode are formed on the same surface. One positive electrode and one negative electrode may be formed, or two or more positive electrodes and two or more negative electrodes may be formed.

The material, the film thickness, and the structure of the electrodes are not particularly limited. The electrodes may have a single layer structure or a stacked-layer structure, the structure including gold, copper, lead, aluminum, or an alloy thereof. Further, on a surface of each electrode, a single layer film or a stacked-layer film made of a metal such as Ni, Ti, Au, Pt, Pd, and W or an alloy thereof may be formed as a pad electrode. Although the film thickness of the electrode is not particularly limited, it is particularly preferable that a layer of Au having a film thickness of about 100 nm or more is provided as a final layer (a layer closest to the surface).

The light emitting element is generally mounted on the base member described above. The light emitting element is fixed to the base member by a joining member. In the case where a light emitting element having the positive electrode and the negative electrode on the same surface is used, the light emitting element may be mounted in a face-up manner or in a flip-chip manner, but it is preferable that the light emitting element is mounted in a flip-chip manner. In this case, the positive electrode and the negative electrode of the light emitting element are disposed so as to face the conductive member, and joined by the joining member. In the case where the light emitting element is mounted in a flip-chip manner, it is preferable that a lower surface of the light emitting element facing the base member is covered by the light reflecting member, which will be described below. The joining member in the case of a flip-chip manner may be made of a material that can physically and electrically connect the light emitting element with the conductive member of the base member. For example, solder materials such as Sn—Cu, Sn—Ag—Cu, and Au—Sn, a metallic bump such as Au, and an anisotropic conductive paste may be used.

In the case where a light emitting element having the positive and negative electrodes respectively on the opposing surfaces is used, a surface on which no electrode is formed (hereinafter, may also be referred to as a first surface or a back surface) is mounted on the wiring pattern and the lead frame of the base member or on the base member excluding a portion where the conductive member is disposed, and then the light emitting element may be fixed to the base member by the joining member. When joining the light emitting element to the conductive member, it is preferable to fix by using the joining member such as a conductive paste containing Ag, Au, Pd, or the like. Accordingly, the electrodes disposed on the back surface may be electrically connected to the wiring pattern of the base member. In addition, when mounting the light emitting element on a portion where the conductive member is not provided, the joining member such as an epoxy resin, a silicone resin, or the like may be used. Further, in view of deterioration due to light or heat from the light emitting element, a metal such as Al or Ag may be coated on the back surface of the light emitting element, and a solder material such as Au—Sn, a brazing filler metal such as a low-melting metal, or a conductive paste may be used as the joining material.

The other surface (hereinafter, may also be referred to as a second surface or an upper surface) provided with the other electrode (hereinafter, may also be referred to as a second electrode) is disposed facing the opposite side with respect to the base member. Generally, the second electrode is electrically connected to a wire.

In the light emitting device according to the present embodiment, only one light emitting element may be mounted on one light emitting device, but a plurality of light emitting elements may be mounted on one light emitting device. When a plurality of light emitting elements are mounted, the type of connection is not particularly limited and for example, parallel, serial, or a combination of both can be employed.

(Light Reflecting Member)

The light reflecting member is disposed on a side surface side of the light emitting element. The light reflecting member may be in contact with a side surface of the light emitting element, or may be spaced apart from the light emitting element. In either case, it is preferable that the light reflecting member is disposed so as to directly or indirectly cover the light emitting element. In this way, light emitted in a lateral direction from the light emitting element may be efficiently extracted upward. In particular, it is preferable that at least a part of the side surface of the light emitting element is covered by the light reflecting member, and it is more preferable that an entire side surface is covered by the light reflecting member. The light reflecting member is preferably disposed so as to be in contact with the light emitting element. Preferably, the light reflecting member covers not only the side surface of the light emitting element, but also the upper surfaces of the wiring pattern and the base member excluding the region on which the light emitting element is mounted. More preferably, the light reflecting member covers between the electrodes of the light emitting element which are connected to the wiring pattern of the base member, and the lower surface of the light emitting element on which the electrodes are formed, and which faces the base member.

In the case where the light reflecting member is disposed spaced apart from the light emitting element, it is preferable that a light transmissive member is disposed between the light reflecting member and the light emitting element. The material for the light transmissive member can be selected from the materials of a first light-transmissive layer constituting a light-transmissive stacked layer, which will be described below. The light transmissive member may also serve as the first light-transmissive layer. In other words, the light reflecting member may be disposed on the side surface side of the light emitting element with the first light-transmissive layer therebetween.

It is preferable that an upper surface of the light reflecting member is flat. The upper surface of the light reflecting member may be flush with the upper surface of the light emitting element, or may be disposed at a position higher than the upper surface of the light emitting element. As used herein, the expression "being flush with" is intended to allow an unintended slight recess formed in a surface due to a weight of the resin. In other words, variations in height of about several tens of micrometers are intended to be included when describing surfaces as "being flush". The light reflecting member is preferably disposed in contact with a lowermost layer of the light-transmissive stacked layer described below, for example, the first light-transmissive layer.

The light reflecting member is preferably made of a reflective material having a reflectance with respect to light from the light emitting element of 60% or more, and more preferably, made of a reflective material having reflectance of 70%, 80%, or 90% or more. Examples of the reflective material include a ceramic, a resin, a dielectric material, pulp, glass, and a composite material of those. Among those, a resin is preferable as being easily formed into any shape.

Examples of the resin include a thermosetting resin and a thermoplastic resin. More specific examples include a resin or a hybrid resin containing at least one of a silicone resin, a modified silicone resin, an epoxy resin, a modified epoxy resin, and an acrylic resin.

Further, these materials, for example, a resin may contain a light reflecting member, a light-scattering material, a coloring agent, or the like, examples of which include titanium dioxide, silicon dioxide, zirconium dioxide, potassium titanate, alumina, aluminum nitride, boron nitride, mullite, niobium oxide, barium sulfate, carbon black, and various rare-earth oxides (e.g., yttrium oxide and gadolinium oxide). Further, a fibrous filler such as glass fiber and wollastonite, an inorganic filler such as carbon black, or a highly heat-dissipating material (e.g., aluminum nitride or the like) may be contained. Such a light reflecting member and the like may be contained, for example, by about 5% to about 60% with respect to an entire weight of the light reflecting member. The light reflecting member may be formed by using screen printing, potting, transfer molding, compression molding, compression molding, injection molding, or the like. Also, the light reflecting member may be formed by using electro-deposition coating or spray coating. In forming the light reflecting member, it is preferable to take a measure, such as using of a mask, so that the light reflecting member does not cover the upper surface of the light emitting element.

In the case where the light reflecting member is disposed spaced apart from the light emitting element, the light reflecting member is preferably disposed as the reflector-like member on the base member, or formed integrally with the base member. Preferably, the upper surface of the light reflecting member is flat. In this case, it is preferable that the light reflecting member has an inclined surface facing the light emitting element. Preferably, the inclined surface has an angle of about 30 degrees to about 80 degrees, about 30 degrees to about 70 degrees, or about 40 degrees to about 70 degrees with respect to an upper surface of the substrate. With such an inclined surface, it is possible to extract light from the upper surface of the light emitting element.

(Light-Transmissive Stacked Layer)

The light-transmissive stacked layer is a member that covers at least an entire upper surface of the light emitting element. In addition to the entire upper surface of the light emitting element, the light-transmissive stacked layer preferably covers around the light emitting element. In the light-transmissive stacked layer, it is sufficient that, for example, one or more of a light-transmissive layer, a wavelength conversion layer, a bandpass filter layer, and an additional functional layer (e.g., a diffusion layer) are stacked, and preferably, two or more light-transmissive layers and two or more wavelength conversion layers are stacked. The stacking order of the layers constituting the light-transmissive stacked layer is not particularly limited, but it is preferable that layers having different functions are alternately disposed.

The bandpass filter layer has a function of transmitting or reflecting only a specific wavelength or only a wavelength on a longer wavelength side of a specific wavelength. Therefore, in the case where the bandpass filter layer is disposed between the light emitting element and the light-transmissive stacked layer, the light emitted from the light emitting element can be allowed to transmit therethrough so that the light subjected to wavelength conversion at the wavelength conversion layer can be suppressed from returning to the light emitting element.

In the case where two or more light-transmissive layers and two or more wavelength conversion layers are stacked, it is preferable that a first light-transmissive layer, a first wavelength conversion layer, a second light-transmissive layer, and a second wavelength conversion layer are stacked in this order from a side of the light emitting element. The first light-transmissive layer is preferably in contact with the upper surface of the light emitting element. In particular, it is preferable that the light-transmissive stacked layer include the first light-transmissive layer covering the upper surface of the light emitting element and the upper surface of the light reflecting member, the first wavelength conversion layer disposed on the first light-transmissive layer, the second light-transmissive layer disposed on the first wavelength conversion layer, and the second wavelength conversion layer disposed on the second light-transmissive layer.

With such a light-transmissive stacked layer, it is possible to reliably reduce leakage of wavelength unconverted light or color unevenness of the light while maintaining or improving the light extraction efficiency. In particular, by providing the first light-transmissive layer which covers the upper surface of the light emitting element, it is possible to greatly reduce return light, which is the light emitted from the light emitting element and then returned to the light emitting element reflected by the phosphor, compared to a configuration in which the wavelength conversion layer is disposed immediately on top of the light emitting element. Accordingly, it is possible to reduce the return light absorbed by the light emitting element, and as a result, it is possible to increase the light flux and to improve the light extraction efficiency.

Further, stacking the second light-transmissive layer on the first light-transmissive layer and the first wavelength conversion layer allows employing a thinner first light-transmissive layer compared to the case where the first light-transmissive layer has a necessary thickness in order to ensure the strength required for the light-transmissive stacked layer. Thus, it is possible to reduce, as much as possible, the amount of wavelength unconverted light leaking through the side surface of the first light-transmissive layer without going through the wavelength conversion. At the same time, a necessary thickness can be ensured by the second light-transmissive layer, so that the strength of the light-transmissive stacked layer can be maintained. Moreover, even when return light is produced due to reflection by a phosphor in the second wavelength conversion layer which will be described below, it is possible to reduce the probability of the return light to the light emitting element, and to reduce a loss of light. Therefore, it is possible to further improve the light extraction efficiency.

With stacking the second wavelength conversion layer on the first light-transmissive layer and the first wavelength conversion layer, even if an amount of phosphor in the first wavelength conversion layer is reduced in order to reduce return light due to reflection by the phosphor in the first wavelength conversion layer, wavelength conversion can be reliably performed by the second wavelength conversion layer. Thus, it is possible to extract light having a desired wavelength or a desired color.

Further, in the case to obtain emission of white light from the light emitting device, providing the second wavelength conversion layer allows for a reduction in the thickness of each of the wavelength conversion layers compared to a wavelength conversion layer with a single layer structure, so that unevenness in the length of light paths within the wavelength conversion layer can be reduced. Accordingly, it is possible to equalize degrees of wavelength conversion of light emitted from the wavelength conversion layer (that is, color tones). As a result, it is possible to improve color unevenness of the light. In other words, if the wavelength conversion layer is thick, a length of a light path of light moving obliquely to the wavelength conversion layer is remarkably longer as compared to that of light moving vertically to the wavelength conversion layer. A longer light path results in an increased ratio of wavelength conversion by the phosphor. As a result, a wavelength of light emitted after moving vertically to the wavelength conversion layer and a wavelength of light emitted after moving obliquely to the wavelength conversion layer are different. This makes light quality uneven, and causes color unevenness of the light. On the other hand, if the wavelength conversion layer is thin, unevenness in wavelengths of light emitted after moving vertically to the wavelength conversion layer and light emitted after moving obliquely to the wavelength conversion layer is reduced. As a result, color unevenness of the light is improved.

A total thickness of the light-transmissive stacked layer is, for example, about 10 μm to about 200 μm, and preferably about 30 μm to about 80 μm.

It is sufficient that one light-transmissive stacked layer is provided for one light emitting device. In this case, one light-transmissive stacked layer may be provided for one light emitting device having one light emitting element, or one light-transmissive stacked layer may be provided for one light emitting device having a plurality of light emitting elements. Further, two or more light-transmissive stacked layers may be provided for one light emitting device having a plurality of light emitting elements. In this case, the light-transmissive stacked layers may be provided one on one for the respective light emitting elements, or two or more light emitting elements may be grouped and one light-transmissive stacked layer may be provided for each group. In either case, when the plurality of light emitting elements are covered by one light-transmissive stacked layer, it is preferable that the light-transmissive stacked layer covers a plane area larger than an outer shape of the plurality of light emitting elements or a group of the light emitting elements.

The light-transmissive stacked layer is preferably configured such that the layers constituting the light-transmissive stacked layer have the same plane area and the same shape, and that all side surfaces of the layers are flush with one another, that is, aligned. However, a part of the side surfaces of some of the layers may be projected or recessed.

(Light-Transmissive Layer)

The light-transmissive layer is a layer for transmitting light emitted from the light emitting element, preferably transmitting 60% or more of the light emitted from the light emitting element, and more preferably 70%, 80%, or 90% or more. Such a layer may be made of a resin such as a silicone resin, a modified silicone resin, an epoxy resin, a phenol resin, a polycarbonate resin, an acrylic resin, a trimethylpentene resin, a polynorbornene resin, and a hybrid resin containing at least one of these resins, glass, or the like.

The light-transmissive layer may contain a phosphor and/or a diffusion material, or the like, which will be described below, but it is preferable that the light-transmissive layer does not contain a phosphor and/or a diffusion material, or the like and is substantially formed of only the materials described above. This is because it is possible to reduce light reflected by a phosphor and/or a diffusion material and returned to the light emitting element as much as possible, and to reduce a loss of light absorbed by the light emitting element. For example, in a case where the light-transmissive stacked layer includes two or more light-transmissive layers, only one of, two or more of, or all of the layers may contain a phosphor and/or a diffusion material, or the like.

In particular, when the light-transmissive stacked layer includes the first light-transmissive layer and the second light-transmissive layer in this order from the side of the light emitting element, it is preferable that both of the first light-transmissive layer and the second light-transmissive layer do not contain a phosphor and/or a diffusion material, or the like. However, the second light-transmissive layer and a light-transmissive layer disposed on a light extraction side may contain a phosphor and/or a diffusion material, or the like. In order to stack and fix the light-transmissive layers, the light-transmissive layer may be provided with, on its upper and lower surfaces, extremely thin light-transmissive layers of about several micrometers that serve as an adhesive agent.

It is sufficient that the light-transmissive layer is plate-like or sheet-like. A thickness of the light-transmissive layer is not particularly limited, but may be about 10 μm to about 500 μm, preferably about 10 μm to about 100 μm, and more preferably about 20 μm to about 80 μm. It is preferable that the light-transmissive layer has an even thickness, but may be partially thick or thin. The upper surface or the lower surface of the light-transmissive layer may be a concavo-convex surface that is partially or entirely convex and/or concave. For example, when the first light-transmissive layer having the light reflecting member disposed on the side surface side of the light emitting element and that is in contact with the light emitting element covers the side surface side of the light emitting element directly (in contact) or indirectly (spaced apart), the first light-transmissive layer may cover the upper surfaces of the light emitting element and the light reflecting member directly (in contact) or indirectly (spaced apart). Optionally, the first light-transmissive layer may cover between the light emitting element and the light reflecting member. Therefore, the lower surface of the light-transmissive layer may be concavo-convex in conformity to the shape of the upper surface and/or the side surface, or the like of the light emitting element and the light reflecting member.

In the case where two or more light-transmissive layers are stacked, thicknesses of these layers may be different from each other, but it is preferable that the thicknesses of these layers are similar. In particular, the first light-transmissive layer disposed on the side of the light emitting element may be adjusted as needed according to a direction of the light emitted from the light emitting element, and for example, the thickness of a thinnest portion is preferably about 30 μm to 50 μm. With such a thickness, it is possible to balance leakage of light having unconverted wavelength with light returned to the light emitting element, out of light emitted from the light emitting element and emitted from the first light-transmissive layer without going through the wavelength conversion layer. As a result, it is possible to improve color unevenness of the light while improving light extraction efficiency.

A planar shape of the light-transmissive layer may be adjusted as needed according to a size and a shape of the light emitting device and arrangement of the light emitting elements, or the like. For example, the light-transmissive layer may have the same planar dimension and shape as the upper surface of the light emitting element, but it is preferable, as described above, that the light-transmissive layer is larger than the light emitting element, and have the same planar dimension and planar shape as a planar shape constituting an outer shape of the light emitting device. Accordingly, it is possible to provide a smaller light emitting device with a simple configuration. In the case where a plurality of light-transmissive layers are stacked, the planar dimensions and shapes of all of the layers are not required to be the same, but it is preferable that the plurality of light-transmissive layers have the same planar dimension and shape. In particular, it is preferable that the plurality of light-transmissive layers are stacked such that their side surfaces are aligned.

(Wavelength Conversion Layer)

The wavelength conversion layer contains a phosphor. In this case, the wavelength conversion layer may be made of a phosphor alone, or may be a layer made of a light transmissive resin material containing a phosphor as described above. The phosphor that is known in the art may be used. Examples of the phosphor include cerium-activated yttrium aluminum garnet (YAG), cerium-activated lutetium aluminum garnet (LAG), europium-activated and/or chromium-activated nitrogen-containing calcium aluminosilicate ($CaO—Al_2O_3—SiO_2$), and europium-activated silicate (($Sr,Ba)_2SiO_4$). Accordingly, it is possible to configure the light emitting device emitting light of a mixed color (e.g., white) of primary light and secondary light in visible wavelengths, and the light emitting device emitting secondary light in visible wavelengths excited by primary light which is ultraviolet light.

Further, it is possible to adjust color rendering properties and/or color reproducibility using phosphors such as $Si_{6-Z}Al_ZO_ZN_{8-Z}$:Eu, $BaMgAl_{10}O_{17}$:Eu, $BaMgAl_{10}O_{17}$:Eu,Mn, $(Zn,Cd)Zn$:Cu, $(Sr,Ca)_{10}(PO_4)_6Cl_2$:Eu,Mn, $(Sr,Ca)_2Si_5N_8$:Eu, $CaAlSiB_xN_{3+x}$:Eu, $K_2SiF_6$:Mn, $(Sr,Ca)AlSiN_3$:Eu, and $CaAlSiN_3$:Eu. A quantum dot phosphor may also be used.

In a case where the layer is made of a resin material containing a phosphor, it is preferable that the phosphor of, for example, about 5% by weight to 200% by weight with respect to an entire weight of the wavelength conversion layer is contained.

The wavelength conversion layer may contain a diffusion material or the like. Examples of the diffusion material include silica, titanium oxide, zirconium oxide, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide, glass, carbon black, crystals or a sintered compact of a phosphor, a sintered compact with a bonding material of an inorganic phosphor, and the like. In a case where the layer is made of the resin material or the like containing a diffusion material or the like, it is preferable that a diffusion material or the like of, for example, about 5% by weight to 30% by weight with respect to an entire weight of the wavelength conversion layer is contained.

In a case where two or more wavelength conversion layers are stacked, kinds of the phosphor and/or the diffusion material in these layers may or may not be the same. For example, it is possible to dispose, from the side closer to the light emitting element, a green phosphor, a red phosphor or a yellow phosphor thereon, and a red phosphor thereon, or the order may be opposite. Further, in the case where two or more wavelength conversion layers are stacked, it is preferable that the layer on a side farther from the light emitting element contains a greater amount of the phosphor and/or the diffusion material. For example, when the first wavelength conversion layer (the side closer to the light emitting element) and the second wavelength conversion layer are disposed, it is preferable that an amount of phosphor in the first wavelength conversion layer is smaller than an amount of phosphor in the second wavelength conversion layer. Here, a difference in the amounts may be adjusted as necessary within the range described above depending on the number of stacked wavelength conversion layers, a kind of the phosphor, a color intended by the light emitting device, and the like. With such a difference in the contents, the amount of the contained phosphor and/or diffusion material on the side closer to the light emitting element can be decreased, so that it is possible to reduce the return light to the light emitting element due to reflection by the phosphor. At the same time, it is possible to ensure necessary wavelength conversion, diffusion, or the like on the side farther from the light emitting element, and to obtain light having a desired color, wavelength, and light distribution.

It is preferable that the wavelength conversion layer is plate-like or sheet-like. The thickness of the light-transmissive layer is not particularly limited, but may be about 0.1 μm to about 100 μm, preferably about 1 μm to about 50 μm, and more preferably about 1 μm to about 30 μm. It is preferable that the wavelength conversion layer has an even thickness, but may be partially thick or thin. When two or more wavelength conversion layers are stacked, thicknesses of these layers may be different from each other, but it is preferable that the thicknesses of these layers are similar.

A planar shape of the wavelength conversion layer may be adjusted as necessary according to a size and a shape of the light emitting device and arrangement of the light emitting elements, or the like. For example, the wavelength conversion layer may have the same planar dimension and shape as the upper surface of the light, emitting element, but it is preferable that the wavelength conversion layer is larger than the light emitting element, and have the same planar dimension and planar shape as those of the light-transmissive layer described above, in particular, the first light-transmissive layer. Accordingly, the wavelength conversion layer has the same planar dimension and planar shape as the planar shape constituting the outer shape of the light emitting device, and it is possible to provide a smaller light emitting device with a simple configuration. When a plurality of wavelength conversion layers are stacked, the planar dimension s and shapes of all of the layers are not required to be the same, but it is preferable that the plurality of light-transmissive layers have the same plane area and shape. In particular, it is preferable that the plurality of wavelength conversion layers are stacked such that their side surfaces are aligned.

In a case where one or more additional functional layers are stacked, these layers may be stacked between the layers, above or below the light-transmissive stacked layer. When one or more additional functional layers are stacked, the additional layers may have at least the same planar dimension and planar shape as the upper surface of the light emitting element, but the plane area and the planar shape are preferably larger than those of the light emitting element. It is preferable that side surfaces of the additional functional layers are aligned with the side surfaces of the light-transmissive layer and/or the wavelength conversion layer, which are described above.

A method of forming the light-transmissive stacked layer is not particularly limited, and a method known in the art may be used. For example, there may be used a method in which the light-transmissive layer, the wavelength conversion layer, and optionally the additional functional layer, which are plate-like or sheet-like, are sequentially stacked, and are integrally fixed by providing an extremely thin light transmissive adhesive agent or the like between the layers; a method of sequentially stacking these layers by potting, screen printing, spray coating, or the like; and a method combining the above methods, for example, forming a plurality of layers by potting, screen printing, spray coating, or the like on the plate-like or sheet-like layer and stacking the layers. For screen printing, spray coating, or the like, a screen printing apparatus, a spray coating apparatus, or the like may be used. The screen printing may be a single application or a laminated printing of two times or more. The spray coating may be continuous spraying, but it is preferable to employ a pulsed-spray method in which spraying is performed in a pulsed manner (intermittently). Accordingly, it is possible to form a layer having even thickness even if a surface to be sprayed is concavo-convex.

The light emitting device according to the present embodiment may be provided with, in addition to the light emitting element, a protective element and the like. One protective element may be provided or two or more protective elements may be provided. Here, the protective element may be any of known elements such as a Zener diode and a diode of a transistor.

Hereinafter, embodiments of the light emitting device according to the present embodiment will be described with reference to the drawings.

First Embodiment

Figure 1A:
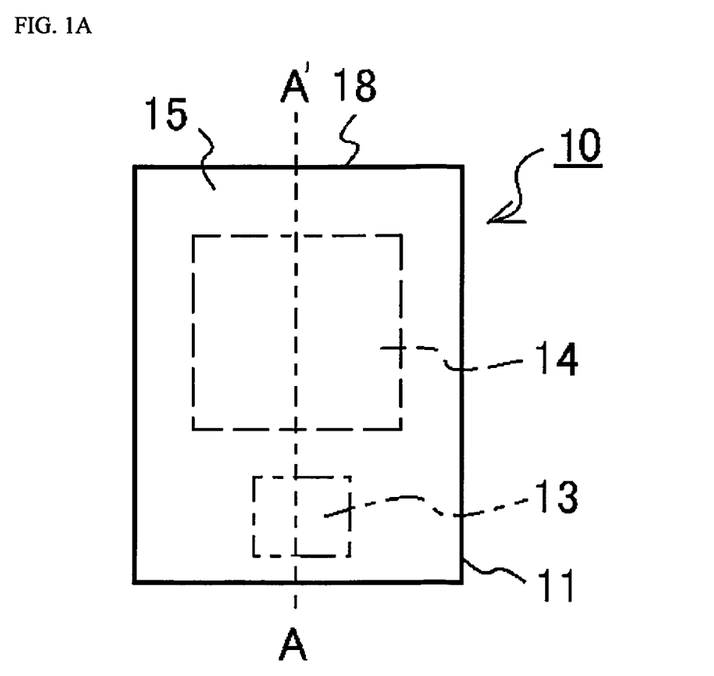
FIG. 1A is a schematic plan view illustrating one embodiment of a light emitting device according to an embodiment of the present invention.
Figure 1B:
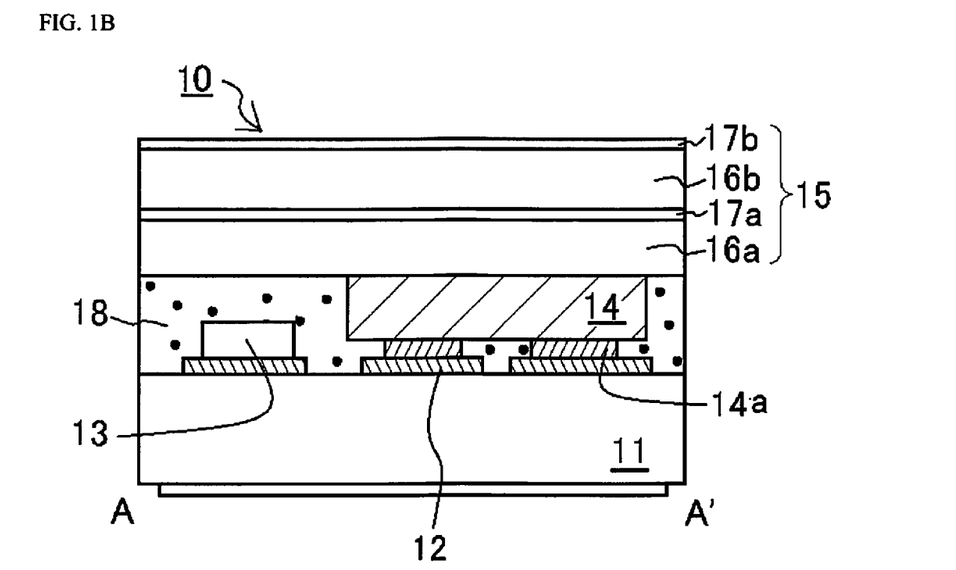
FIG. 1B is a sectional view taken along line A-A' in FIG. 1A.
Figure 1C:
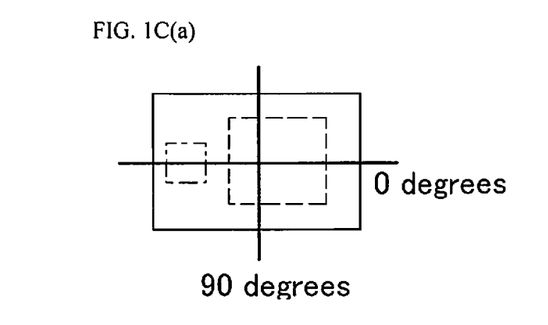

A light emitting device 10 according to the first embodiment is shown in FIGS. 1A and 1B. The light emitting device 10 includes a base member 11, a light emitting element 14 mounted on the base member 11, a light reflecting member 18 covering a side surface of the light emitting element 14, and a light-transmissive stacked layer 15 covering an upper surface of the light emitting element 14.

The base member 11 may be configured such that, for example, one of a plurality of titanium, palladium, and gold are stacked on a surface of a plate member made of aluminum nitride to form a wiring pattern 12. A surface of the wiring pattern 12 is gold plated. The base member 11 has a substantially rectangular planar shape (1.8 mm×2.2 mm). The light emitting element 14 may be configured such that a semiconductor layer is stacked on a light transmissive insulating substrate, positive and negative electrodes 14a are formed on an entire surface on a side of the semiconductor layer, and mounted in a flip-chip manner on the base member 11 by Au—Sn eutectic solder as a joining member. The light emitting element 14 has a substantially square planar shape (1.4 mm×1.4 mm). A protective element 13 is further disposed on the wiring pattern 12 of the base member 11.

An entire side surface of the light emitting element 14 is covered by the light reflecting member 18 so as to be in contact with each other. The light reflecting member 18 is formed of a silicone resin containing titanium oxide on the order of 30% by weight. The upper surface of the light emitting element 14 (that is, a surface of the light transmissive insulating substrate) and an upper surface of the light reflecting member 18 that covers the side surface of the light emitting element 14 are aligned so as to be flush with each other. Preferably, the light reflecting member 18 is disposed so as to cover or to be filled in, not only the side surface of the light emitting element 14, but also an upper surface of the base member 11 excluding a region where the light emitting element 14 is mounted, that is, between the electrodes 14a connected to the wiring pattern 12 of the base member 11, and between a lower surface, on which the electrodes 14a are formed, of the light emitting element 14 facing the base member 11, and the base member 11/the wiring pattern 12. The protective element 13 is embedded in the light reflecting member 18.

The light-transmissive stacked layer 15 is disposed on the light emitting element 14. The light-transmissive stacked layer 15 has a planar dimension that is larger than that of the light emitting element 14 and substantially the same as that of the base member 11, and has substantially the same shape as the base member 11. The light-transmissive stacked layer 15 is disposed so as to cover an entire upper surface of the light emitting element 14 and an entire upper surface of the protective element 13 covered by the light reflecting member 18. The light-transmissive stacked layer 15 may be configured such that a first light-transmissive layer 16a in contact with the light emitting element 14, a first wavelength conversion layer 17a, a second light-transmissive layer 16b, and a second wavelength conversion layer 17b are stacked in this order.

The first light-transmissive layer 16a and the second light-transmissive layer 16b are made of a silicone resin, and have a thickness of 50 µm respectively. The first wavelength conversion layer 17a and the second wavelength conversion layer 17b are made of a silicone resin containing YAG (phosphor) of 30% by weight and 70% by weight, respectively, with respect to an entire weight of the respective wavelength conversion layers. The first wavelength conversion layer 17a and the second wavelength conversion layer 17b each have a thickness of 30 µm. The light-transmissive stacked layer 15 is formed by spray coating the first wavelength conversion layer 17a and the second wavelength conversion layer 17b respectively on a surface of the first light-transmissive layer 16a and a surface of the second light-transmissive layer 16b, and stacking these two layers.

Side surfaces of the first light-transmissive layer 16a, the first wavelength conversion layer 17a, the second light-transmissive layer 16b, and the second wavelength conversion layer 17b are flush with one another, and form an outer shape of the light emitting device 10.

A light emitting device manufactured as a comparative example of the light emitting device 10 has substantially the same configuration as the light emitting device described above, other than that the second light-transmissive layer and the second wavelength conversion layer of the light-transmissive stacked layer are not provided, and that the thicknesses of the first light-transmissive layer and the first wavelength conversion layer are doubled.

A light flux is measured for the light emitting device 10 according to the first embodiment and the light emitting device of the comparative example. The light flux is a value measured when a current of 350 mA is applied to the light emitting device based on an integrating sphere measurement under the condition of Tj=25° C. As a result, assuming that the light emitting device of the comparative example is 100, the light flux in the light emitting device 10 (n=10) is improved by about 3%.

Further, when the light distribution chromaticity is measured, as shown in FIGS. 1C(a) to 1C(c), at both 0° and 90° of a light distribution angle of the light emitting device, it is confirmed that leakage of light whose wavelength is not converted is reduced at a portion close to a lateral direction (a portion where the directional angle is wide). Accordingly, reduction of color unevenness of the light is expected, and adjustment of light having desired chromaticity is further facilitated.

As described above, according to the light emitting device of the first embodiment, by providing the light-transmissive stacked layer, it is possible to reliably reduce leakage of light whose wavelength has not been converted while improving light extraction efficiency. Accordingly, an improvement of color unevenness of the light is expected, and it is possible to easily adjust light having desired chromaticity.

Second Embodiment

Figure 2:
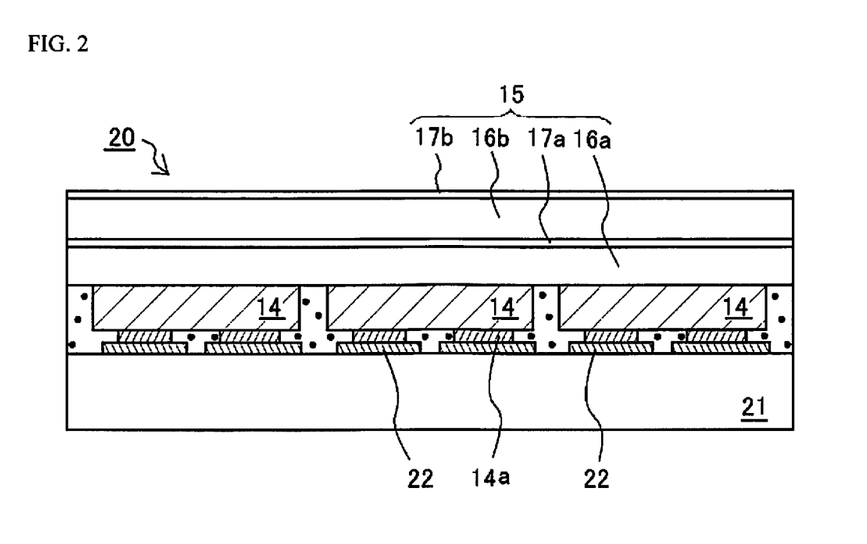
FIG. 2 is a schematic sectional view illustrating another embodiment of the light emitting device according to an embodiment of the present invention.

As illustrated in FIG. 2, a light emitting device 20 of the second embodiment has substantially the same configuration as that of the light emitting device 10 of the first embodiment, other than that three light emitting elements 14 are mounted on a base member 21 (substantially rectangular planar shape, 1.8 mm×5.0 mm) having a wiring pattern 22 on its surface instead of the protective element 13, and that a size of the light-transmissive stacked layer 15 is altered accordingly. Therefore, the same effect as the light emitting device 10 of the first embodiment can be obtained.

Third Embodiment

Figure 3:
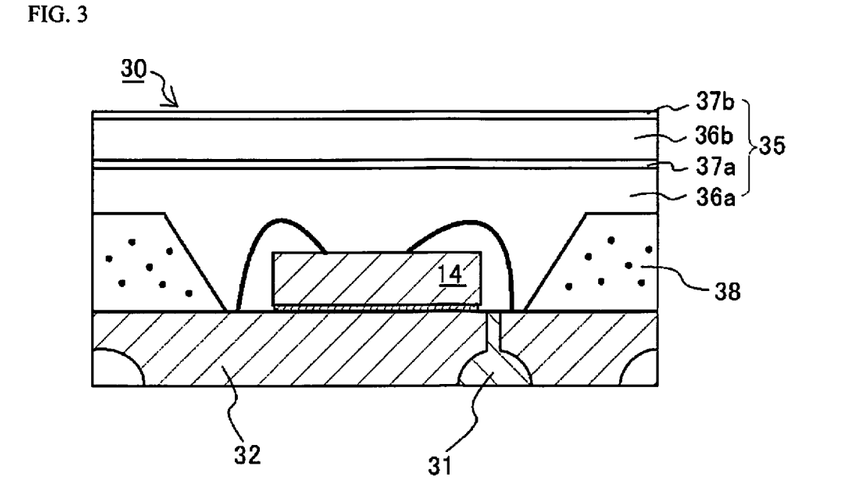
FIG. 3 is a schematic sectional view illustrating yet another embodiment of the light emitting device according to an embodiment of the present invention.

As illustrated in FIG. 3, a light emitting device 30 of the third embodiment is configured such that a light reflecting member 38 is integrally disposed on a base member 31 in which positive and negative lead frames 32 are embedded. In the light reflecting member 38, a surface of the lead frame 32 including a central part of the light emitting device 30 is exposed, and the light emitting element 14 is mounted on the exposed surface via a joining member. The electrodes and the lead frames of the light emitting element are electrically connected by at least one wire. The light reflecting member 38 has an inclined surface facing the light emitting element 14, so as to encircle around the light emitting element 14, such that a planar dimension on an upper surface side of the light emitting device 30 is greater than the exposed surface. An upper surface of the light reflecting member 38 is positioned higher than the upper surface of the light emitting element 14 (for example, at a position 40 μm high from the upper surface of the base member 31).

A light-transmissive stacked layer 35 is disposed on the light emitting element 14. The light-transmissive stacked layer 35 has a planar dimension that is larger than that of the light emitting element 14 and substantially the same as that of the base member 31, and has substantially the same shape as the base member 31. The light-transmissive stacked layer 35 is disposed so as to cover an entire upper surface of the light emitting element 14 and an upper surface of the light reflecting member 38.

The light-transmissive stacked layer 35 is configured such that a first light-transmissive layer 36a in contact with the light emitting element 14, a first wavelength conversion layer 37a, a second light-transmissive layer 36b, and a second wavelength conversion layer 37b are stacked in this order.

The first light-transmissive layer 36a is not only in contact with the light emitting element 14, but also filled between the light reflecting member 38 and the light emitting element 14, and disposed over the upper surface of the light emitting element 14 to the upper surface of the light reflecting member 38. A thickness of the first light-transmissive layer 36a at the upper surface of the light reflecting member 38 is 50 μm.

Other than the above, the light emitting device 30 of the third embodiment has substantially the same configuration as the light emitting device 10 of the first embodiment. Therefore, the same effect as the light emitting device 10 of first embodiment can be obtained.

INDUSTRIAL APPLICABILITY

The light emitting device according to the embodiments of the present invention can be applied, with high reliability, not only to a lighting device used for image reading devices such as facsimiles, photocopiers, hand scanners and the like, but also to various lighting devices such as light sources for lighting, LED displays, backlight light sources for mobile phones and the like, traffic lights, illuminated switches, in-vehicle stop lamps, various sensors, and various indicators.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
   a base member;
   a light emitting element mounted on the base member and including a pair of electrodes facing the base member, the light emitting element including a light-transmissive substrate and a semiconductor layer stacked on the light-transmissive substrate;
   a light reflecting member in contact with and covering an entirety of a side surface of the light emitting element and a part of a lower surface of the light emitting element between the pair of electrodes while an upper surface of the light emitting element is exposed from the light reflecting member;
a protective member mounted on the base member, the protective member being embedded in the light reflecting member, an upper surface and a side surface of the protective member being in contact with and covered by the light reflecting member; and
a light-transmissive stacked layer being disposed above the upper surface of the light emitting element and the upper surface of the protective member so that the light-transmissive stacked layer overlaps the light emitting element and the protective member in a plan view, and so that the upper surface of the light emitting element exposed from the light reflecting member is bonded to the light-transmissive stacked layer while the light reflecting member is disposed between the upper surface of the protective member and the light-transmissive stacked layer, the light-transmissive stacked layer having a flat-plate shape including a first surface facing the upper surface of the light emitting element, a second surface opposite from the first surface, and side surfaces extending between the first surface and the second surface so that the light emitted from the light emitting element is extracted through the second surface and the side surfaces of the light-transmissive stacked layer, the light-transmissive stacked layer including:
a first light-transmissive layer;
a first wavelength conversion layer disposed on the first light-transmissive layer;
a second light-transmissive layer disposed on the first wavelength conversion layer; and
a second wavelength conversion layer disposed on the second light-transmissive layer, wherein
the first light-transmissive layer, the first wavelength conversion layer, the second light-transmissive layer and the second wavelength conversion layer define the side surfaces of the light-transmissive stacked layer with the light emitted from the light emitting element being extracted at least through side surfaces of the first light-transmissive layer,
a part of side surfaces of the light emitting device is defined by the side surfaces of the light-transmissive stacked layer and side surfaces of the light reflecting member,
an entire upper surface of the light emitting device is defined by an upper surface of the second wavelength conversion layer of the light-transmissive stacked layer,
in a plan view, the light emitting element is smaller than each of the first light-transmissive layer, the first wavelength conversion layer, the second light-transmissive layer, and the second wavelength conversion layer,
in the plan view, the light emitting device is virtually divided into four equal areas by a virtual centerline extending along a longitudinal direction and a virtual centerline extending along a crosswise direction with the light emitting element and the protective member being arranged so that the light emitting element straddles all of the four equal areas, and the protective member is arranged only on one side of the virtual centerline extending along the crosswise direction while the protective member straddles two areas divided by the virtual centerline extending along the longitudinal direction.

2. The light emitting device according to claim 1, wherein the upper surface of the light emitting element is flush with an upper surface of the light reflecting member.

3. The light emitting device according to claim 1, wherein the first light-transmissive layer covers the upper surface of the light emitting element and an upper surface of the light reflecting member.

4. The light emitting device according to claim 1, wherein the first light-transmissive layer is in contact with and covers the upper surface of the light emitting element and an upper surface of the light reflecting member.

5. The light emitting device according to claim 1, wherein an upper surface of the base member, excluding a region on which the light emitting element is mounted, is covered by the light reflecting member.

6. The light emitting device according to claim 1, wherein each of the side surfaces of the first light-transmissive layer, each of side surfaces of the first wavelength conversion layer, each of side surfaces of the second light-transmissive layer, and each of side surfaces of the second wavelength conversion layer are flush with one another.

7. The light emitting device according to claim 1, wherein the first wavelength conversion layer and the second wavelength conversion layer include a phosphor, and an amount of the phosphor in the first wavelength conversion layer is smaller than an amount of the phosphor in the second wavelength conversion layer.

8. The light emitting device according to claim 1, wherein plane areas of the first light-transmissive layer, the first wavelength conversion layer, the second light-transmissive layer, the second wavelength conversion layer and the base member as viewed along a direction normal to the base member are substantially the same.

9. The light emitting device according to claim 1, wherein the second light-transmissive layer having a thickness that is larger than a thickness of the first wavelength conversion layer.

10. The light emitting device according to claim 9, wherein
the second light-transmissive layer having the thickness that is larger than a thickness of the second wavelength conversion layer.

11. The light emitting device according to claim 1, wherein
the second light-transmissive layer having a thickness that is larger than a thickness of the second wavelength conversion layer.

12. The light emitting device according to claim 1, wherein
each of the side surfaces of the first light-transmissive layer, each of side surfaces of the first wavelength conversion layer, each of side surfaces of the second light-transmissive layer, and each of side surfaces of the second wavelength conversion layer substantially lie in the same plane.

13. The light emitting device according to claim 1, wherein
each of the side surfaces of the first light-transmissive layer, each of side surfaces of the first wavelength conversion layer, each of side surfaces of the second light-transmissive layer, each of side surfaces of the second wavelength conversion layer, and each of side surfaces of the light reflecting member substantially lie in the same plane.

14. The light emitting device according to claim 1, wherein
each of the side surfaces of the first light-transmissive layer, each of side surfaces of the first wavelength conversion layer, each of side surfaces of the second light-transmissive layer, each of side surfaces of the second wavelength conversion layer, each of side surfaces of the light reflecting member, and each of side surfaces of the base member substantially lie in the same plane.

15. The light emitting device according to claim 1, wherein
the first wavelength conversion layer and the second wavelength conversion layer include the same type of a phosphor.

* * * * *

UNITED STATES PATENT AND TRADEMARK OFFICE
CERTIFICATE OF CORRECTION

PATENT NO. : 10,629,783 B2
APPLICATION NO. : 14/552602
DATED : April 21, 2020
INVENTOR(S) : Yuta Oka Page 1 of 1

It is certified that error appears in the above-identified patent and that said Letters Patent is hereby corrected as shown below:

On the Title Page

Column 2, please add in [56] References Cited:
--- 2008/0231181 A1 9/2008 Pang
2012/0261700 A1 10/2012 Ooyabu et al. ---

Signed and Sealed this
Seventh Day of July, 2020

Andrei Iancu
*Director of the United States Patent and Trademark Office*